US006960490B2

(12) United States Patent
Cunningham

(10) Patent No.: US 6,960,490 B2
(45) Date of Patent: *Nov. 1, 2005

(54) METHOD AND RESULTING STRUCTURE FOR MANUFACTURING SEMICONDUCTOR SUBSTRATES

(75) Inventor: Shaun Joseph Cunningham, New South Wales (AU)

(73) Assignee: EpiTactix Pty Ltd., Marsfield (AU)

( * ) Notice: Subject to any disclaimer, the term of this patent is extended or adjusted under 35 U.S.C. 154(b) by 0 days.

This patent is subject to a terminal disclaimer.

(21) Appl. No.: 10/634,512

(22) Filed: Aug. 4, 2003

(65) Prior Publication Data

US 2004/0124501 A1 Jul. 1, 2004

Related U.S. Application Data

(63) Continuation-in-part of application No. 10/389,278, filed on Mar. 13, 2003.

(30) Foreign Application Priority Data

Mar. 14, 2002 (AU) ............................................. PS1122

(51) Int. Cl.⁷ ......................... H01L 21/44; H01L 21/48; H01L 21/50
(52) U.S. Cl. ...................... 438/107; 438/118; 438/121; 438/455; 438/459; 438/975; 438/977
(58) Field of Search ................................ 438/107, 118, 438/121, 455, 459, 975, 977

(56) References Cited

U.S. PATENT DOCUMENTS

| 3,689,993 A | 9/1972 | Tolar |
| 3,755,026 A | 8/1973 | Reynolds |
| 3,864,819 A | 2/1975 | Ying |
| 3,903,592 A | 9/1975 | Heckl |
| 3,913,215 A | 10/1975 | Heckl |
| 3,973,320 A | 8/1976 | Greco et al. |
| 3,986,251 A | 10/1976 | Altemus et al. |
| 4,297,717 A | 10/1981 | Li |
| 4,811,079 A | 3/1989 | Turina et al. |
| 4,856,702 A | 8/1989 | Kloucek |
| 5,198,695 A | 3/1993 | Hanes et al. |
| 5,292,686 A | 3/1994 | Riley et al. |
| 5,346,848 A | 9/1994 | Grupen-Shemansky et al. |
| 5,389,803 A | 2/1995 | Mohammad |
| 5,399,512 A | 3/1995 | Mohammad et al. |

(Continued)

FOREIGN PATENT DOCUMENTS

| JP | 60-116749 | 6/1985 |
| JP | 60-144932 | 7/1985 |
| JP | 03-156935 | 7/1991 |
| WO | WO 2003/077311 A1 | 9/2003 |

OTHER PUBLICATIONS

Derwent Abstract Accession No. 85–187602/31, International Class P61, JP60–116749 A (Sumitomo Elec Ind. KK), Jun. 24, 195.

*Primary Examiner*—Lynne A. Gurley
(74) *Attorney, Agent, or Firm*—Townsend and Townsend and Crew LLP

(57) ABSTRACT

A method of manufacturing bonded substrates. The method includes providing a metallic substrate. The metal substrate has a predetermined thickness. The method also includes bonding a first thickness of compound semiconductor material overlying the metallic substrate and reducing a thickness of the first thickness of compound semiconductor material to a second thickness. The method includes forming one or more via structures through a portion of the second thickness of compound semiconductor material to a portion of the underlying metal substrate, whereupon the via structure electrically connects to the metal substrate.

25 Claims, 9 Drawing Sheets

U.S. PATENT DOCUMENTS

| | | | |
|---|---|---|---|
| 5,536,361 A | | 7/1996 | Kondo et al. |
| 5,698,453 A | * | 12/1997 | Green et al. .................. 438/73 |
| 5,825,090 A | | 10/1998 | Piccone |
| 5,837,556 A | * | 11/1998 | Ostendorf et al. ............. 438/4 |
| 5,985,739 A | | 11/1999 | Plettner et al. |
| 6,093,577 A | | 7/2000 | van der Groen et al. |
| 6,211,562 B1 | | 4/2001 | Forbes et al. |
| 6,248,646 B1 | | 6/2001 | Okojie |
| 6,319,778 B1 | | 11/2001 | Chen |
| 6,335,263 B1 | * | 1/2002 | Cheung et al. ............. 438/455 |
| 6,468,824 B2 | | 10/2002 | Chen et al. |
| 6,537,846 B2 | * | 3/2003 | Lee et al. .................... 438/102 |
| 6,555,405 B2 | | 4/2003 | Chen et al. |
| 6,562,648 B1 | * | 5/2003 | Wong et al. .................. 438/46 |
| 2001/0010389 A1 | | 8/2001 | Forbes et al. |
| 2001/0044194 A1 | * | 11/2001 | Hara .......................... 438/455 |
| 2002/0137243 A1 | | 9/2002 | Chen et al. |
| 2002/0137244 A1 | | 9/2002 | Chen et al. |
| 2003/0017679 A1 | * | 1/2003 | Lee et al. .................... 438/455 |
| 2003/0178637 A1 | | 9/2003 | Chen et al. |

* cited by examiner

Basic Description of via trench process:

Front side processing complete except for via holes

Wafer covered with photoresist. PR exposed using standard front-side mask alignment techniques and developed to expose GaAs wafer at certain locations Via holes/trenches etched using standard etching techniques such as reactive ion etching. PR removed.

Metal deposited to cover walls of via holes/trenches

Notes on via hole parameters:

Standard via holes are round with diameters in range 50 – 100 microns. They have between 8 and 16pH of inductance. By increasing the perimeter of the via hole eg so that it forms a trench, a much lower indcutance eg 1pH can be obtained. This lower inductance is of benefit in circuits such as amplifiers and filters which require low impedance ground connections at very high frequencies.

FIG 8

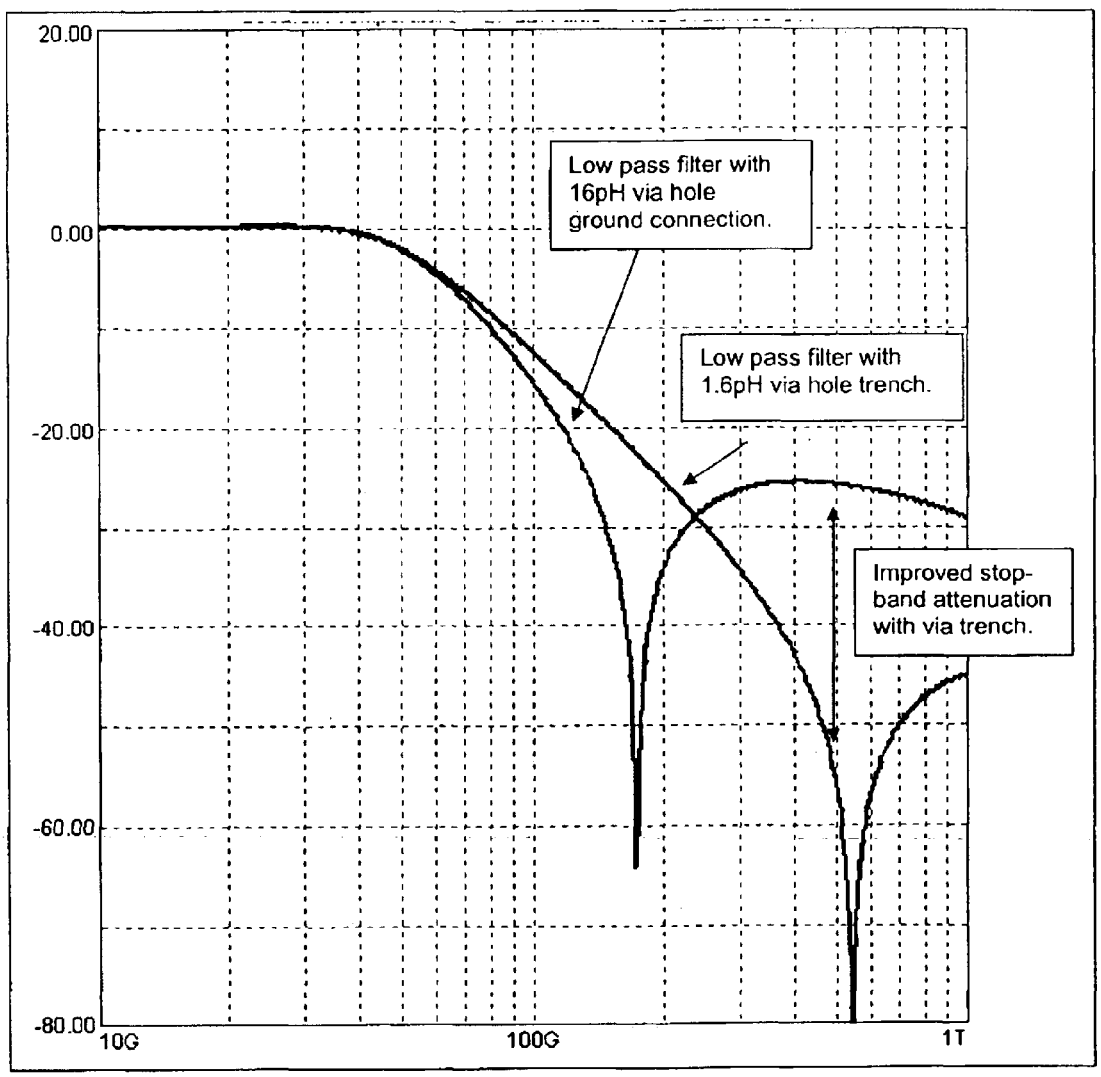

Description of "Metal Box" Feature:

GaAs chip bonded to CuMo substrate with active circuitry on top.

Wafer covered with polymer such as polyimide. Polymer then patterned by photolithography to cover only certain areas of wafer.

Wafer covered with metal. Metal is patterned to only cover polymer.

Via hole trench is etched through GaAs surrounding area of active circuitry.

Metal deposited to cover via trench walls, thereby forming walls of screened box.

Optionally: polymer is disolved from under metal "air bridge" to reduce capacitance to active circuitry..

Notes:

Although the diagrams above show the box "top" being formed first, the walls ie trenches could be formed first with the top added later.

Side view of "box":

METHOD AND RESULTING STRUCTURE FOR MANUFACTURING SEMICONDUCTOR SUBSTRATES

CROSS-REFERENCES TO RELATED APPLICATIONS

This application is a continuation in part of U.S. Ser. No. 10/389,278 filed Mar. 13, 2003, which claims priority to Australian Provisional Patent Application No. PS1122 filed Mar. 14, 2002, commonly assigned, and hereby incorporated by references for all purposes.

STATEMENT AS TO RIGHTS TO INVENTIONS MADE UNDER FEDERALLY SPONSORED RESEARCH OR DEVELOPMENT

BACKGROUND OF THE INVENTION

The present invention relates generally to manufacturing substrates. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But it would be recognized that the invention has a much broader range of applicability.

As technology progresses, semiconductor manufacturers have continually strived to use ever larger wafers to obtain economies of scale, and consequently lower the cost of individual semiconductor devices. Commonly, silicon crystal boules can be readily grown large enough to slice into 12 inch diameter wafers. The 12 inch wafers have been produced for single crystal silicon materials for a variety of applications. Although the single crystal silicon has many benefits, there are still numerous disadvantages.

Many conventional industries have been increasingly reliant on compound semiconductor devices fabricated from compound semiconductors such as gallium arsenide, indium phosphide, and gallium nitride. Unfortunately, integrated circuits made from these semiconducting compounds are still relatively expensive compared to circuits made from silicon semiconductors. This cost difference is largely attributable to the respective material costs, and wafer processing costs. Other limitations also exist with compound semiconductor materials.

Compound semiconductor wafers are more prone to damage. For example, they are more brittle than conventional single crystal silicon wafers. Growing large crystal boules of compound semiconductor material is extremely difficult compared with growing large single crystal silicon boules. The maximum diameters for commercially-produced compound semiconductor wafers of gallium arsenide, indium phosphide and gallium nitride are respectively six inches, four inches and two inches in conventional commercial applications.

Larger compound semiconductor wafers would be desirable. Unfortunately, larger diameter wafers are difficult to make efficiently. Even if larger boules of compound semiconductor material could be produced, handling the resulting large-diameter compound semiconductor wafers would generally be problematic. Compound semiconductor wafers of the desired thickness and diameter would be extremely fragile and prone to breakage. Here, the larger wafers would generally break due to the brittle nature of these semiconductor compounds. Accordingly, certain techniques have been proposed to manufacture larger compound semiconductor wafers using an epitaxial grown layer.

As merely an example, a conventional process for fabricating compound semiconductor chips could be outlined in steps (i) to (vii) listed below.

(i) Grow epitaxial device layers on mono-crystalline substrate.

(ii) Pattern these epitaxial layers and other deposited dielectric and metallic layers using photolithographic techniques.

(iii) Bond wafers face-down to a temporary supporting substrate after front-side process is complete.

(iv) Thin wafers by mechanical grinding or lapping back-side.

(v) Create "via holes" in the substrate, which provide a means for connecting the back-side ground to appropriate front-side ground connections.

(vi) Deposit a metal film on the wafer's back-side to provide a ground plane, and coat the walls of the via holes, thereby making contact with the front-side ground connections.

(vii) Dice wafer into individual chips.

In the above conventional process, wafers are typically 625 $\mu$m in thickness during steps (i), (ii) and (iii), and have sufficient mechanical strength to avoid breakage with careful handling. Wafers are typically thinned to around 50 to 100 $\mu$m in thickness in step (iv). Thinning wafers has numerous advantages, which relate to:

(i) reducing the depth (and also the size) of via holes, as well as parasitic inductance associated with the via holes;

(ii) conducting heat away from front-side devices towards the back-side, which is normally attached to a heat sink; and (iii) preventing electromagnetic resonance in the substrate at high frequencies.

Handling thinned compound semiconductor wafers is often difficult, and compound semiconductor wafers are commonly broken from step (iv) onwards. Breakage is costly, since most of the processing (steps (i) to (iii)) is already complete. The fragility of compound semiconductor materials also causes breakages of resulting chip devices, and restricts the larger size of practical chip designs that use compound semiconductor materials. Here, larger sized compound semiconductor materials are not practical to make efficiently.

In conventional compound semiconductor wafer processing, via holes are also required to connect certain grounded circuit elements on the front side of the wafer to the ground plane on the back side. Typically these via holes are etched from the back side of the wafer towards the front side elements. Certain limitations exist with processing of via holes for compound semiconductor wafers. Difficulties often arise because of a need to align features on one side of the wafer with corresponding features on the other side of the wafer. Alignment tolerances of these via hole features are therefore poor. Additionally, there is often a restriction on the number and shape of via holes because they reduce the mechanical strength of the wafer. These and other limitations have been described throughout the present specification and more particularly below.

In view of the above, a need exists for improved techniques for producing and handling semiconductor wafers. In particular, a need exists for techniques suitable for assisting practical and cost-effective production of compound semiconductor devices.

BRIEF SUMMARY OF THE INVENTION

According to the present invention, techniques for manufacturing substrates are provided. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But, it would be recognized that the invention has a much broader range of applicability.

In a specific embodiment, the invention provides a method of manufacturing bonded substrates. The method includes providing a metallic substrate. The metal substrate has a predetermined thickness. The method also includes bonding a first thickness of compound semiconductor material overlying the metallic substrate and reducing a thickness of the first thickness of compound semiconductor material to a second thickness. The method includes forming one or more via structures through a portion of the second thickness of compound semiconductor material to a portion of the underlying metal substrate, whereupon the via structure electrically connects to the metal substrate.

In an alternative specific embodiment, the invention provides a method for manufacturing composite substrates for semiconductor devices. The method includes providing a metal substrate, which has a first diameter and a bonding surface. The method includes bonding a plurality of tiles overlying the bonding surface. Each of the tiles is coupled to a portion of the bonding surface. Each of the tiles has a shape and size to be able to form an array configuration. The method also includes elevating a temperature of the plurality of tiles and metal substrate and forming a eutectic bond between each of plurality of tiles and portion of the bonding surface. The elevating of the temperature is provided while each of the tiles is substantially stationary relative to the metal substrate. The method forms a plurality of active devices on each of the plurality of tiles and forms a plurality of openings through each of tiles. Each of the openings traverses through a portion of one of the tiles through a portion of the eutectic bond to a portion of the metal substrate to form a via structure. Additionally, the method includes forming an interconnect layer to connect the portion of the one of the active devices through the portion of the tile through the eutectic bond to the portion of the metal substrate. The interconnect layer that connects the portion of one of the active devices through the portion of one of the tiles through the portion of the eutectic bond to the portion of the metal substrate.

In still an alternative specific embodiment, the invention includes a method of manufacturing bonded substrates. The method includes providing a metallic substrate, which has a predetermined thickness. The method also includes bonding a first thickness of compound semiconductor material overlying the metallic substrate and reducing a thickness of the first thickness of compound semiconductor material to a second thickness. The method also forms a trench region surrounding a portion of the second thickness of the compound semiconductor material. Additionally, the method forms a conductive material within the trench region to isolate the portion of the second thickness of the compound semiconductor using the conductive material in the trench region and a portion of the underlying metallic substrate.

In yet an alternative embodiment, the invention provides a substrate structure for high frequency devices. The substrate structure includes a metallic substrate, which is used as a ground plane for a high frequency amplifying device operable at a frequency greater than 10 G Hz. A compound semiconductor material is bonded to the metallic substrate. One or more via structures for ground connections is formed within portions of the compound semiconductor material. The one or more via structures is electrically connected to the metallic substrate. The one or more via structures is configured to provide a desired reactance to provide a universal ground reference. The universal ground reference is within a predetermined amount.

Still further, the invention provides an integrated circuit device structure. The integrated circuit device structure includes a metallic substrate, which has a predetermined thickness and a predetermined thermal conductivity. A thickness of compound semiconductor material is bonded to a surface overlying the metallic substrate. A trench region is disposed within a portion of the thickness of the compound semiconductor material and extending to a portion of the metallic substrate. A thermal conductive material is formed within the trench region and thermally coupled to the portion of the metallic substrate. The thermal conductive material is coupled to the portion of the thickness of the compound semiconductor to redistribute thermal energy among the portion of the compound semiconductor, the thermal conductive material, and the metallic substrate.

Various advantages can be achieved through use of a semiconductor tile bonded to a metallic substrate. The semiconductor wafer composite is less fragile than the semiconductor tile, and can thus be handled in larger areas. As a result, cost savings can be achieved through larger volume fabrication. In particular, compound semiconductor wafers that have been hitherto produced from smaller diameter wafers can be processed in any effective size through the use of multiple semiconductor tiles. Consequently, existing fabrication equipment for treating 12 inch diameter silicon wafers can be used to fabricate compound semiconductor devices using the described semiconductor wafer composite. Other benefits can also be achieved in one or more embodiments, as follows:

1) There can be more via holes without reducing structural strength of wafer;
2) The via holes can be any shape including trenches without reducing structural strength;
3) The trenches can be arranged to almost entirely enclose a particular circuit or circuit element thereby providing electromagnetic shielding, thermal isolation or heat spreading;
4) The trenches can be arranged with underlying metal substrate and overarching metallic "air bridges" to form sidewalls, bottom and top respectively of electromagnetically screened on-chip "metal boxes" which can be used to isolate circuit elements from sources of interference;
5) The via holes and trenches are formed using a front side process which is easily aligned to other front side features.

Depending upon the embodiment, one or more of these benefits may be achieved. These and other benefits are described throughout the present specification and more particularly below.

BRIEF DESCRIPTION OF THE DRAWINGS

FIG. 8 is a simplified plot of a frequency characteristic of a via structure according to an embodiment of the present invention.

DETAILED DESCRIPTION OF THE INVENTION

According to the present invention, techniques for manufacturing substrates are provided. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But it would be recognized that the invention has a much broader range of applicability.

A semiconductor wafer composite is described herein. The composite is well suited to fabrication of compound semiconductor devices. Further, the composite has particular application in the context of large scale production of such devices. The semiconductor wafer composite from which the individual semiconductor devices are fabricated is first described, followed by a procedure for high volume production of semiconductor devices using the described semiconductor wafer composite.

Figure 1:
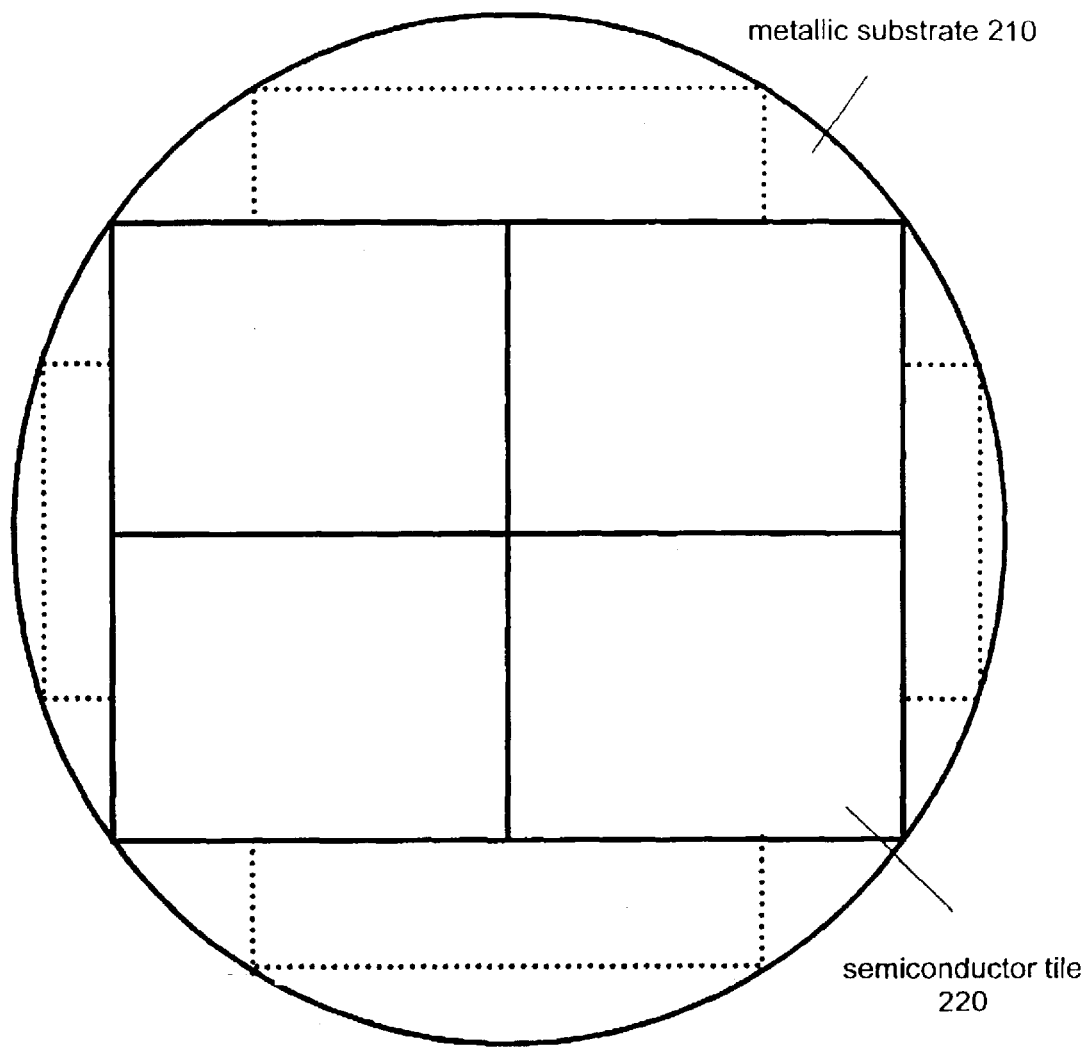
FIG. 1 is a simplified schematic representation of a view, from above, of a semiconductor wafer composite comprising a circular metallic substrate on which four square semiconductor tiles are bonded according to an embodiment of the present invention.
Figure 2:
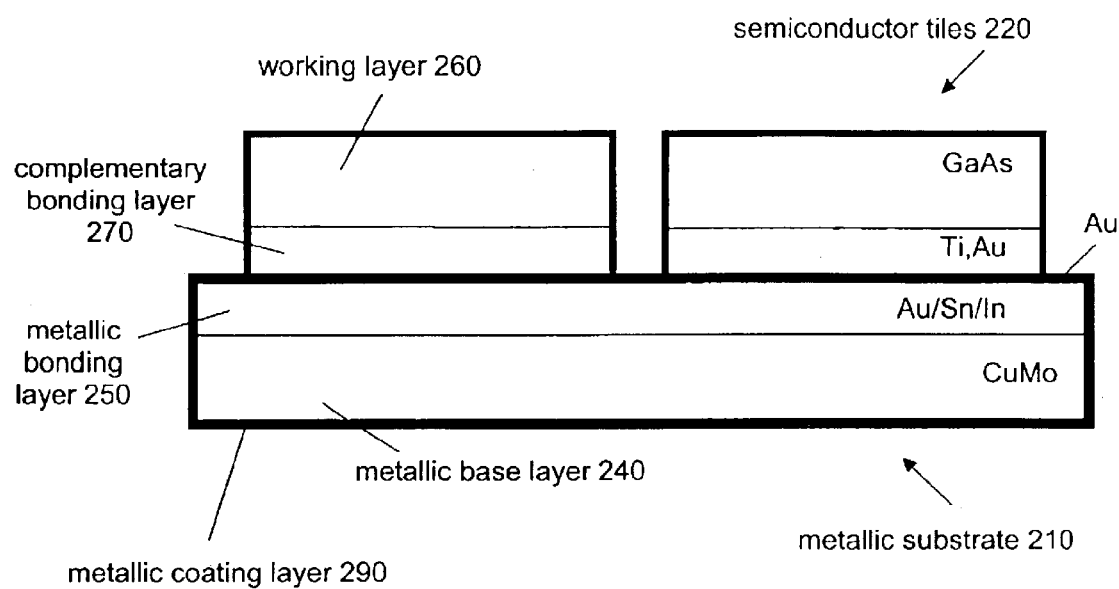
FIG. 2 is a simplified cross-sectional view corresponding with FIG. 1.

FIGS. 1 and 2 schematically represent a simplified semiconductor wafer composite, using top and side views respectively according to an embodiment of the present invention. This diagram is merely an example, which should not unduly limit the scope of the claims herein. One of ordinary skill in the art would recognize many variations, modifications, and alternatives. The semiconductor wafer composite effectively replaces existing semiconductor wafers from which semiconductor chip devices are fabricated.

The described semiconductor wafer composite represented in FIGS. 1 and 2 comprises a metallic substrate 210 upon which is bonded a number of semiconductor tiles 220.

FIG. 1 represents the metallic substrate 210 as circular in shape, and represents four abutting rectangular semiconductor tiles 220. The four rectangular shapes shown in dotted outline represent further rectangular semiconductor tiles 220 that may be bonded to the metallic substrate 210 near the periphery of the metallic substrate 210, to more efficiently use the surface of the metallic substrate 210. The substrate is preferably made from materials which have good electrical and thermal conductivity and whose coefficient of thermal expansion matches that of the semiconductor tiles. For example, CuMo, AlSi and Mo are suitable materials. Preferably, the substrate is highly conductive with resistivity in the range 1 to 10 micro ohm centimeters ($1-10\times10^{-6}$ ohm-cm) according to a specific embodiment. Alternatively, the material can be semiconductor according to other embodiments. The tiles 220 are closely placed together, through perhaps not directly abutting. A slight spacing between wafer tiles 220 eases tile dimension accuracy requirements and allows for slight thermal expansion gaps, if desirable. Indicative gap dimensions may be, for example, less than 5 $\mu$m. Preferably, each of the tiles should have a slight gap to separate them from each other to account for any differences in tolerances. Alternatively, the tiles are abutting each other to prevent or reduce impurities (e.g., photoresist) from entering regions between the tiles according to other embodiments.

FIG. 2 is a side view that corresponds with FIG. 1. The peripheral semiconductor tiles 220 depicted in dotted outline in FIG. 1 are not represented in FIG. 2. The metallic substrate 210 comprises a metallic base layer 240, upon which is formed a metallic bonding layer 250. The metallic base layer 240 may be formed of a suitable metal or alloys that matches the coefficient of thermal expansion (CTE) of the compound semiconductor material. For a gallium arsenide (GaAs) compound semiconductor tile 220, a suitable choice of metallic substrate 210 is copper molybdenum (CuMo). The metallic bonding layer 250 is desirably formed of tin (Sn) or indium (In) and gold (Au), or other suitable metals having a relatively low melting point, and which form a eutectic alloy upon heating. In preferred embodiments, the eutectic alloy is provided purely from compression and free from relative lateral movement between the tile and substrate.

The semiconductor tiles 220 comprise a working layer 260 of compound semiconductor material (such as gallium arsenide (GaAs)), and a complementary bonding layer 270 preferably formed of a material that assists the semiconductor tile 220 to adhere to the metallic substrate 210. A suitable material is a combination of titanium (Ti) and gold (Au).

Surrounding the metallic base layer 240 and metallic bonding layer 250 is a thin metallic coating layer 290, formed of a noble metal. Gold (Au) or platinum (Pt) is preferably used. The coating layer 290 seals the metallic substrate 210 from damage during subsequent fabrication of semiconductor devices from the semiconductor wafer composite. The coating layer 290 can be applied by evaporation/deposition techniques, or by electroplating, for example.

While components of the semiconductor wafer composite are described above with reference to FIGS. 1 and 2, various other associated features and advantages of the semiconductor wafer composite are described below with reference to a process for manufacturing the semiconductor wafer composite. This manufacturing process is described herein with reference to steps 310 to 330 of FIG. 3. Remaining steps 340 to 370 of FIG. 3 describe subsequent steps in fabricating semiconductor devices from the semiconductor wafer composite.

In a specific embodiment, each of the tiles has a specific size and shape. The metal substrate also has a desired shape and size. That is, the metal substrate has a diameter "dm", which is chosen according to the capabilities of the intended wafer processing equipment. This dimension is preferably selected from a set of industry diameters, e.g., 2 inch, 3 inch, 4 inch, 5 inch, 6 inch, 8 inch, 12 inch. The substrate is shaped to provide a "flat" on one part of the circumference that acts as an alignment reference, which is similar to conventional wafers.

Further, the substrate may be patterned to provide apertures which aid packaging operations or which facilitate the coupling of signals off chip. For example, the apertures may be used to form slots which radiate high frequency signals off chip.

The tiles would be cut from circular compound semiconductor wafers of radius "ds" where an integral number of wafer diameters "ds" equate to the metal substrate diameter "dm" ie dm=n×ds where n is the smallest possible integer. This relationship ensures the least number of tiles and minimum wastage of expensive compound semiconductor material in cutting tiles to the appropriate shape. For example, four square tiles with 3 inch diagonal dimensions could be cut from 3 inch semiconductor wafers to cover a six inch metallic substrate in a 2×2 tile array. If only 2 inch diameter semiconductor wafers were available, nine square tiles with 2 inch diagonals could be prepared to cover a six inch substrate in a 3×3 array. Of course, there would be various modifications, alternatives, and variations.

Although the semiconductor wafer described above is illustrated using a specific embodiment, there can be many variations, alternatives, and modifications. For example, the metal substrate can be made of an alloy or other material, as well as other multilayered materials and the like, which have desirable electrical and thermal characteristics. The metal substrate can also be multi-layered, depending upon the application. Additionally, one or more of the tiles can be made of a different material on the substrate. These and other variations can be found throughout the present specification and more particularly below.

Figure 3:
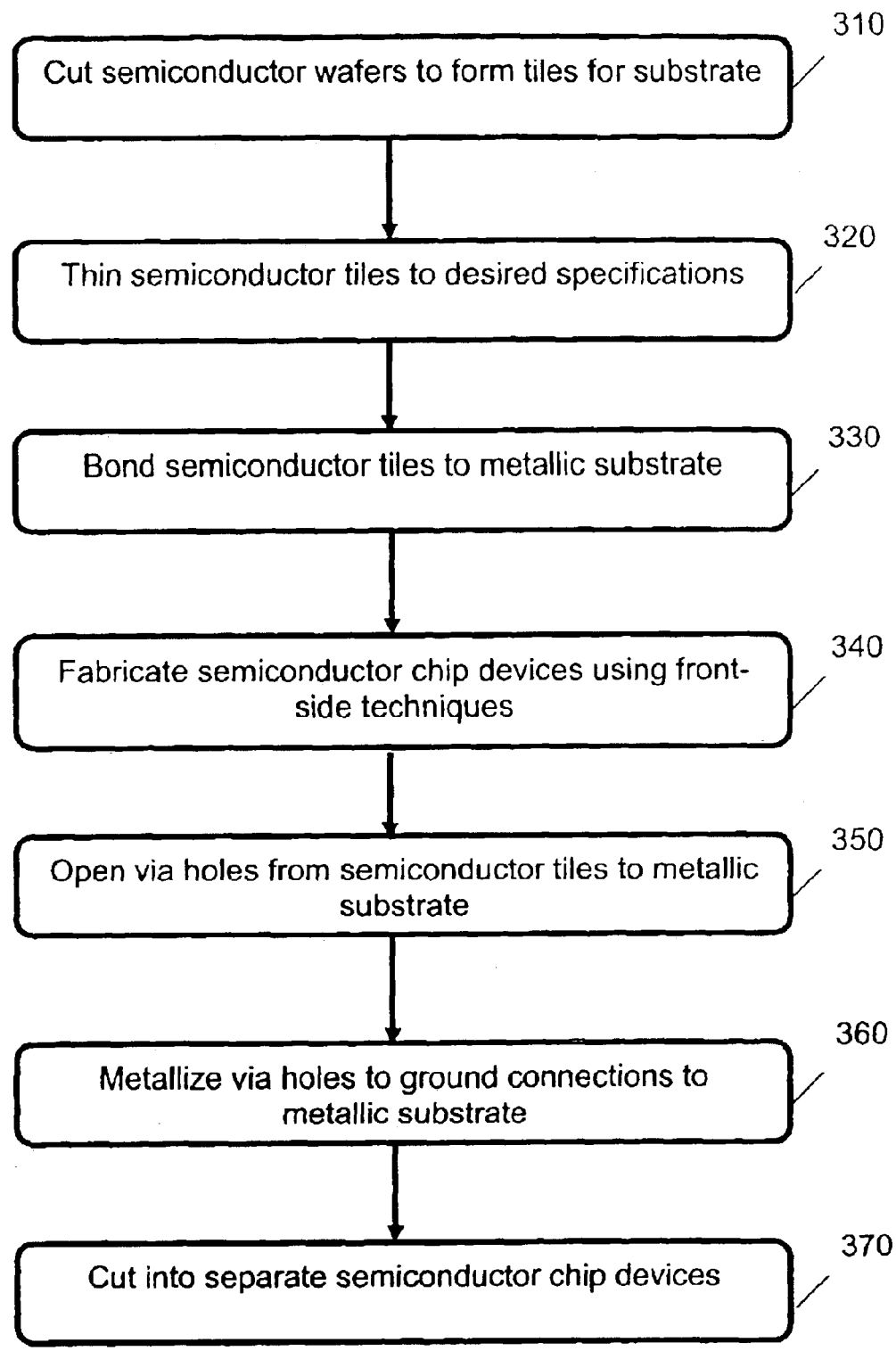
FIG. 3 is a simplified flowchart of a method involved in fabricating semiconductor chips from the semiconductor wafer composite of FIGS. 1 and 2 according to an embodiment of the present invention.
Figure 4:
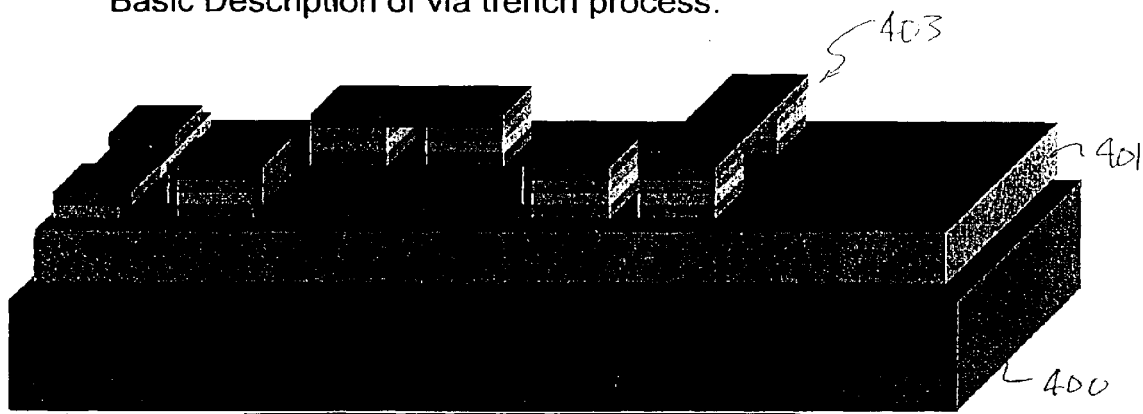
FIGS. 4–7 illustrate a simplified method of forming a via structure according to an embodiment of the present invention.
Figure 5:
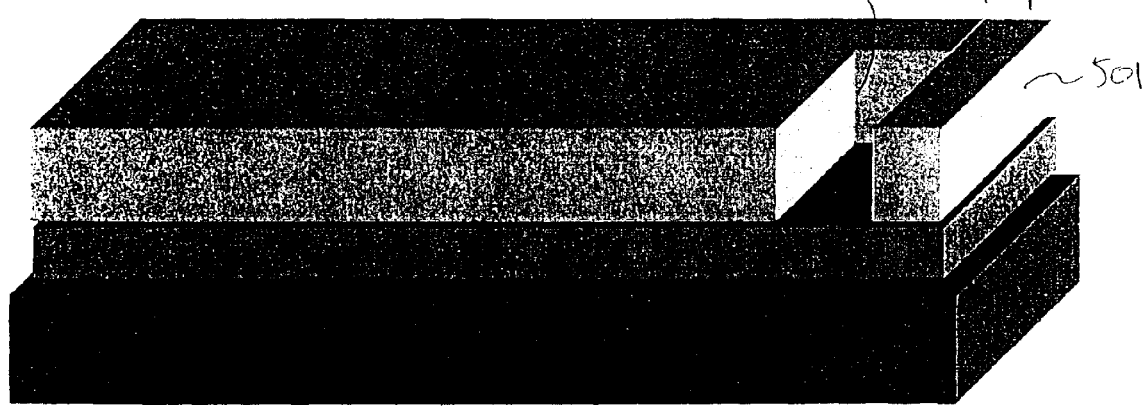

In a specific embodiment, a method for fabricating compound semiconductor devices involves, in overview, the steps listed below in Table 1. FIG. 3 flowcharts these steps, which are described in further detail below.

TABLE 1

Step 310 Multiple semiconductor wafers are thinned 220.
Step 320 The wafers 220 are cut to form semiconductor tiles.
Step 330 The semiconductor tiles 220 are bonded to the metallic substrate 210.
Step 340 Standard front-side processing techniques are used to fabricate devices.
Step 350 Via holes are opened from the front-side to the metallic substrate 210.
Step 360 Via holes are metalized to make ground connections to the metallic substrate 210.
Step 370 The metallic substrate 210 is cut to separate individual chips.

As shown above, the above steps are merely illustrative. Depending upon the embodiment, certain steps can be further separated or even combined with other steps. Additional steps can be added depending upon the embodiment. Other steps can replace certain steps above. Accordingly, there can be many variations, modifications, and alternatives. Further details of each the steps can be found throughout the present specification and more particularly below.

Thinning Semiconductor Tiles—Step 310

Individual wafer tiles 220 are thinned according to existing processing techniques. If the wafers break at this point, the associated cost is relatively low since the front side of the semiconductor tile 220 has not been processed. According to a specific embodiment, tiles are thinned using a lapping/grinding and/or polishing operation. The tiles can be thinned to a thickness of about 50 to 100 microns according to certain embodiments. According to a specific embodiment, tiles are thinned using a lapping/grinding and/or polishing operation.

Forming Semiconductor Tiles—Step 320

Semiconductor wafers are cut to form semiconductor tiles 220. Preferably, each of the tiles is provided using a scribing and breaking process. More preferably, scribing can be provided via a diamond stylus, laser cutting, or the like. These are preferably "standard" wafers that have epitaxial layers grown on their front side and are ready for device fabrication. The semiconductor tiles 220 are shaped such that these semiconductor tiles 220 can cover a planar surface with minimal intervening gaps. According to a specific embodiment, each of the tiles is formed along a crystalline plane, which provides an accurate shape and form. Such accurate shape and form allows for alignment between each of the tiles to reduce a possibility of gaps between each of the tiles. This also subsequently enables all tiles to be arranged on the metallic substrate with the same crystal orientation.

Bonding Tiles to Substrate—Step 330

A metallic substrate material is chosen to match the coefficient of thermal expansion (CTE) of the chosen semiconductor over the required range of processing temperatures. The substrate material is also chosen for its strength, thermal and electrical conductivity and cost. Preferably, the substrate also has a high thermal conductivity to carry away heat from an integrated device formed thereon. According to certain embodiments, the thermal conductivity of the metallic substrate can be 165 Watts/m-Kelvin or greater.

For example, an alloy of approximately 80% molybdenum and 20% copper matches the CTE of gallium arsenide and has suitable electrical and thermal conductivity. An advantage of using a metallic substrate 210 is that the CTE can be adjusted by changing the composition of the metal alloy. No such adjustment is possible if a crystalline substrate such as silicon is used.

The metallic substrate 210 is polished on one face and its perimeter is shaped to suit large diameter wafer processing equipment. Preferably, polishing reduces a possibility of air gaps forming between the surface of the substrate and the tiles. The metallic substrate has a surface roughness no greater than a predetermined amount and a uniformity of less than a certain amount across the substrate in certain embodiments to facilitate the bonding process. According to certain embodiments, the surface can also include a series of patterns and/or textures, which prevent the formation of air bubbles, etc. and enhance the bonding process. This typically means the metallic substrate 210 is circular in shape (as represented in FIGS. 1 and 2). A minor flat on one side can be provided, for compatibility with existing wafer processing equipment.

The metallic substrate 210 is preferably made as thin as possible so as not to increase the weight or heat capacity of the composite structure. A typical thickness might be in the range 200 $\mu$m to 400 $\mu$m.

An inert coating layer 290 is then deposited on the metallic substrate 210 if there is a risk that the substrate 210 might be effected by subsequent semiconductor process chemistry. A thin layer (typically less than 1 $\mu$m in thickness) of a noble metal such as gold or platinum is generally suitable for this purpose. Preferably, the coating is non-reactive with subsequent semiconductor processing steps. Other materials (such as silicon nitride) can also be used, provided such materials have sufficient resistance to process chemistry and temperatures used in the intended wafer processing steps.

The bonding layer 250 is deposited on the polished surface of the metallic substrate 210. This metallic bonding layer 250 is preferably made from two or more metals that form a eutectic alloy on heating. The outermost layer is preferably a noble metal (such as gold) that prevents the underlying layers from oxidising before and during bonding. Underlying layers may be formed of tin or indium. These metals are chosen such that the eutectic alloy forms at relatively low temperature (for example, 200 Degrees Celsius) and having formed, does not melt at the elevated temperatures encountered during wafer processing. The bonding layer may also serve as the inert coating layer for the metallic substrate.

A complementary bonding layer 270 is also deposited on the back-side of each thinned semiconductor wafer tile 220. This complementary bonding layer 270 is also preferably metallic and its composition is chosen to provide maximum adhesion to the semiconductor tile 220 over the range of subsequent processing temperatures. The preferred layer structures are titanium/gold or titanium/platinum/gold, but many other combinations of metals are possible without departing from the scope and spirit of the invention.

Numerous other bonding layer compositions are possible, and may be chosen to match particular processing requirements (such as maximum temperature) of different semiconductor materials. For example, it may be advantageous to form the indium or tin bonding layer on the semiconductor wafer instead of the metal substrate in some embodiments. The advantage may come from simplifying the manufacturing processes used to produce the metal substrate and hence reducing overall costs. In this case, the metal substrate's gold passivation layer also serves as the bonding layer.

The use of metallic bonding layers offers the advantage of allowing bonding to occur at relatively low temperatures (for example, 200°). This ensures the epitaxial layer structure of the wafer tiles 220 is not degraded. Non-metallic complementary bonding layers 290 such as silicon, polysilicon, silicon dioxide or silicon nitride may also be used.

Large gaps between semiconductor tiles 220 are desirably avoided as such gaps may adversely affect the spin-deposition of photoresist. The semiconductor tiles 220 are preferably square or rectangular in shape. Such shapes allow arrays of rectangular chips to be efficiently contained inside the semiconductor tiles 220, and also allows semiconductor tiles 220 to be cut by scribing and breaking along crystal planes, which are typically rectangular.

However, other tile shapes may also be used. Hexagonal tiles, for example, may cover the surface of a circular substrate 210 more efficiently than rectangular tiles. The preferred embodiment uses a set of non-uniform square or rectangular tiles as represented in FIG. 1. The selected pattern semiconductor tiles 220 depends on the size of the available semiconductor wafers, and the size of the metallic substrate 210.

The semiconductor tiles 220 are positioned on top of the polished surface of the metallic substrate 210, such that the semiconductor tiles 220 preferably abut each other (or are closely spaced together) to form a substantially continuous semiconductor surface. Small gaps (for example, of less than 5 $\mu$m) may be advantageous for the reasons noted above. The semiconductor tiles 220 are arranged to ensure a common crystal axis orientation. The semiconductor tiles 220 and metallic substrate 210 are then subjected to a compressive force at elevated temperature, which causes a eutectic alloy to form and permanently bond the semiconductor tiles 220 to the metallic substrate 210.

In a specific embodiment, bonding occurs by placing each of the tiles overlying the metal substrate. A bonding layer such as those described herein as well as others is also provided. Bonding occurs using mechanical force between each of the tiles and the substrate to compress the bonding layer. Heating is also provided. In a specific embodiment, heating and pressure (normal to the surface of the tiles and substrate) is applied, while maintaining each of the tiles free from lateral movement with respect to the substrate to form, for example, a eutectic bonding layer between each of the tiles and the metal substrate. Of course, there can be many variations, alternatives, and modifications.

Front-Side Processing of Composite—Step 340

The front-side of the composite wafer is now processed according to standard semiconductor fabrication techniques. Fiducial alignment marks are provided on each tile 220, to allow for slight misalignments between semiconductor tiles 220. Individual chips are preferably arranged on the semiconductor tiles 220, such that the chips are wholly contained within tiles 220 and do not span semiconductor tile boundaries.

Opening via Holes—Step 350

Unlike existing semiconductor processes, which create via holes from the back-side of a wafer toward the front-side, via holes can be made from the front side toward the metallic substrate 210. The alignment of via holes is thus simplified as this alignment is relative to other visible front-side features.

Metallizing via Holes—Step 360

The presence of the metallic substrate 210 allows large areas of the semiconductor tiles 220 to be removed in the via hole process without compromising the structural strength of the composite wafer. This means that via hole "trenches" can be formed on the semiconductor tiles 220. These trenches are able to provide the following features:

(i) relatively low inductance ground connections compared to ordinary round vias;

(ii) electromagnetic screening between adjacent circuits, which is important as circuit densities increase;

(iii) chip separation outlines; and (iv) contouring of the semiconductor wafer to achieve localized heat spreading features.

Cutting into Individual Devices—Step 370

The individual chips are separated by cutting the metallic substrate 210 either from the front-side or back-side depending on the capabilities of the process machinery.

Since each chip is supported by a portion of the metallic substrate 210, chip breakage is reduced during handling. Also, larger chips may be fabricated. As a result, more functions/systems may be integrated on a single chip. Such chips offer considerable cost savings by simplifying engineering and production requirements.

The presence of the metallic substrate 210 on each chip also serves as a heat spreader, which is advantageous in high power applications.

Further Variations

One variation of the above-described fabrication procedure is to bond un-thinned wafer tiles 220 to the metallic substrate 210. The semiconductor tiles 220 may be subsequently thinned when bonded to the metallic substrate 210. This variation provides the advantages of "planarising" the semiconductor surface of the wafer composite during the thinning process. The epitaxial device layers are, as a consequence, grown on the wafer composite.

This revised procedure may provide economic benefits in certain circumstances. Further, handling requirements of wafer tiles 220 before bonding are relaxed as the semiconductor tiles 220 are of greater thickness at this stage.

A metallic bonding layer 250 is described herein, though other techniques may be used to affix the semiconductor tiles 220 to a metallic substrate 210. For example, adhesives adapted to the temperature and chemical processing conditions involved in semiconductor fabrication may be used to adhere semiconductor tiles 220 to a metallic substrate 210.

The techniques described herein are suitable for manufacturing semiconductor devices including those using composite semiconductors large-diameter composite metallic substrates. As well as other benefits described herein, the described techniques potentially offer improved radio frequency performance, improved yield and lower costs through economies of scale.

A method for fabricating contact regions in a semiconductor substrate according to an embodiment of the present invention can be outlined as follows.

1. Provide a metallic substrate having a first diameter and having a bonding surface;
2. Bond a plurality of tiles overlying the bonding surface, each of the tiles being coupled to a portion of the bonding surface, each of the tiles having a shape and size to be able to form an array configuration;
3. Elevate a temperature of the plurality of tiles and metal substrate;
4. Form a eutectic bond between each of plurality of tiles and portion of the bonding surface, whereupon the elevating of the temperature is provided while each of the tiles is substantially stationary relative to the metal substrate;
5. Form a plurality of active devices on each of the plurality of tiles;
6. Form a plurality of openings through each of tiles, each of the openings traversing through a portion of one of the tiles through a portion of the eutectic bond to a portion of the metal substrate to form a via structure;
7. Form an interconnect layer to connect the portion of the one of the active devices through the portion of the tile through the eutectic bond to the portion of the metal substrate.

A method according to an alternative embodiment of the present invention can be outlined as follows:

1. Provide a metallic substrate having a predetermined thickness;
2. Bond a first thickness of compound semiconductor material overlying the metallic substrate;
3. Reduce a thickness of the first thickness of compound semiconductor material to a second thickness;
4. Form one or more via structures through a portion of the second thickness of compound semiconductor material to a portion of the underlying metal substrate, whereupon the via structure electrically connects to the metal substrate (using front side processing);
5. Perform other steps, as desired.

The above sequence of steps provides a way of forming via structures in a multilayered substrate according to an embodiment of the present invention. As shown, these steps include forming a via structure through the compound semiconductor material onto a portion of the underlying metal substrate. The via structure is preferably contacted to the portion of the metal substrate. Preferably, the present invention may overcome certain limitations of conventional methods by forming via holes from the front side of the wafer, thereby allowing for easier alignment. By using the metallic substrate to provide mechanical support for the wafer, the number of via structures or density of such structures can increase to overcome any of the conventional restrictions on the number and shape of via holes. Depending upon the embodiment, there are many variations, alternatives, and modifications.

According to a specific embodiment, a method for fabricating a via structure can be provided as follows.

1. A compound semiconductor structure is fabricating using one or more processes described herein.
2. Photoresist is deposited, exposed and developed to cover the front side of the wafer except where via holes are desired.
3. Reactive ion etching techniques are used to remove semiconductor material down to the metallic substrate to form openings. (The profile (slope) of the sides of these openings can be varied by adjusting the parameters of the etching process. The slope is adjusted to such that the diameter decreases at the metallic substrate end of the via holes.)
4. Metal is deposited over the entire surface of the wafer using evaporation, sputtering or chemical vapour deposition techniques (The metal coats the sides of the via holes and establishes contact between certain front side components and the ground plane provided by the metallic substrate)
5. Excess metal is removed using a second photoresist layer and appropriate etching or ion milling processes.

As shown, the via structures can be made of almost any shape and size depending upon the application. The method provides a way of making elongated via openings' (e.g., holes) or trenches that have very low inductance, i.e., less than 2 pH, which provides low impedance ground connections in high frequency (>10 GHz) circuits such as amplifiers or oscillators. The same feature can be used to provide grounded partitions on-chip, which is useful in isolating adjacent circuits that would otherwise interfere with each other such as radio transmitters and receivers. Further details of the present method can be found throughout the present specification and more particularly below.

FIGS. 4–7 illustrate a simplified method of forming a via structure according to an embodiment of the present invention. This method is merely an example, which should not unduly limit the scope of the claims herein. One of ordinary skill in the art would recognize many variations, alternatives, and modifications. As shown, the method begins by providing a metallic substrate 400, which is similar to the one noted above but can also be others. A compound semiconductor material layer 401 has been bonded to the metallic substrate. Depending upon the embodiment, the compound semiconductor material 401 can be any one of the ones described herein, as well as others, including multilayered structures, depending upon the embodiment. A plurality of integrated device structures have been formed overlying the compound semiconductor material. These device structures including, among others, transistors, diodes, resistors, capacitors, inductors, and circuits made from these components such as amplifiers, mixers, switches. Of course, the particularly integrated device structures depend upon the application.

As further shown, a photosensitive material 501 is formed overlying an upper surface of the integrated circuit device structures. The photosensitive material can include a photoresist, such as Shipley MEGAPOSIT™ SPR™600 Series, but can also be others. The photoresist material is exposed and developed to form one or more patterns 503. Each of these patterns expose an underlying region, which will be for a via structure. The exposed region is preferably the exposed compound semiconductor material. As shown, the photosensitive material is provided on the front side of the substrate, rather than the backside in a specific embodiment.

Figure 6:
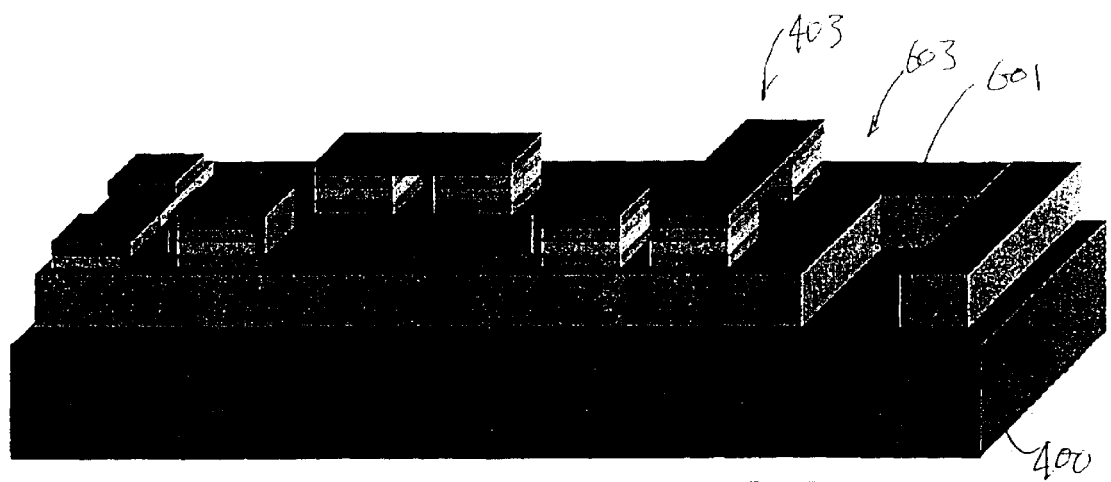
Figure 7:
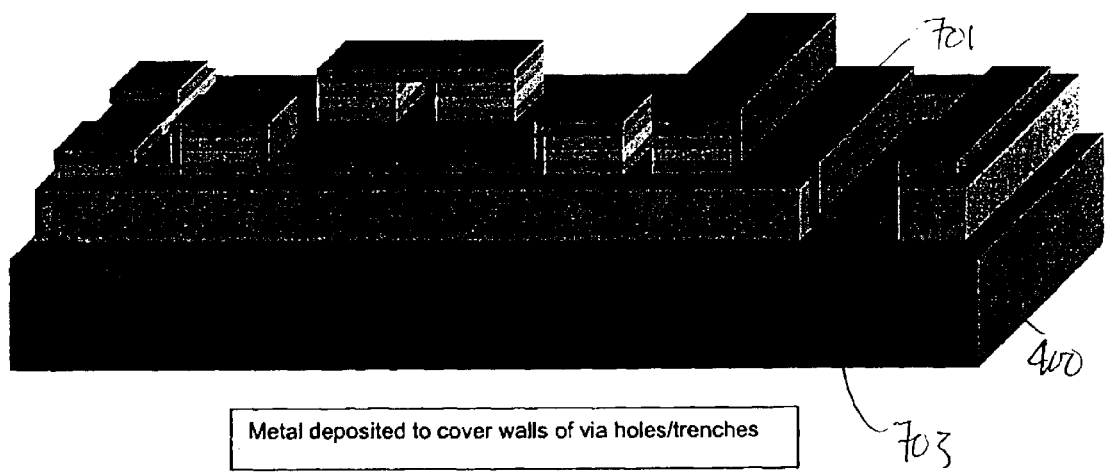
Figure 9:
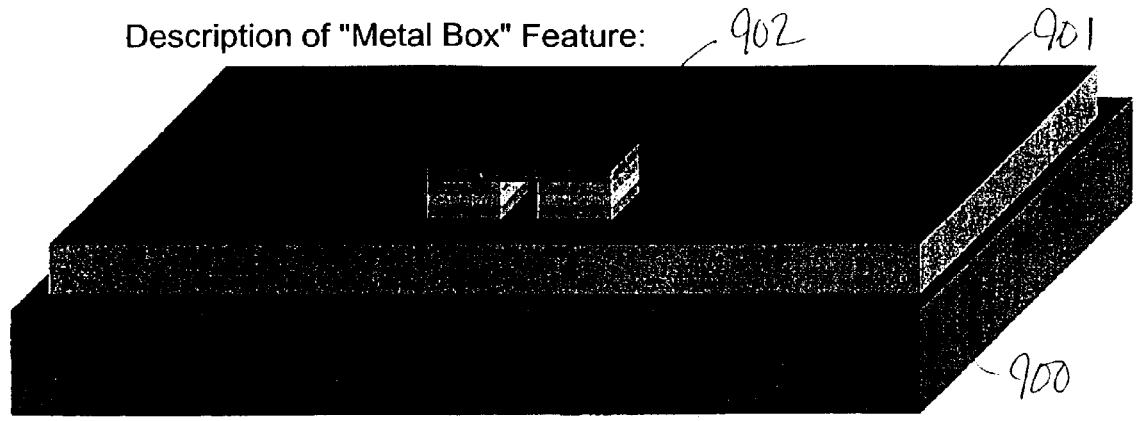
FIGS. 9–15 illustrate a simplified method of forming a semiconductor device according to an alternative embodiment of the present invention.

Referring to FIG. 6, the method removes the exposed portion of the compound semiconductor material to form an opening 601, which extends to the metal substrate. The opening can be of almost any shape and size depending upon the embodiment. The shape is preferably elongated such as a rectangle or other like shape. The size is 50 microns and less or 500 microns and greater, depending upon the embodiment. Additionally, the present invention allows for more via structures per area, i.e., via structure density. As merely an example using gallium arsenide compound semiconductor material, 100 microns thick, 25 via structures can be formed within a region of about one square millimeter. The method then removes the photoresist via standard stripping processes.

The method then forms metal contact structures 701 within the exposed portion of the compound semiconductor material. The metal structure is preferably composed of an adhesion layer such as titanium or the like, covered by a diffusion barrier made from platinum and a contact layer made of gold or other suitable material. Other metals may be substituted in place of those mentioned such as substituting copper for gold. Techniques such as plating, spluttering, and/or vapor deposition are used to form the metal layer. The metal layer can also include multiple metal layers. Depending upon the embodiment, the metal layer can be patterned to form metal interconnect structures.

FIG. 8 is a simplified plot of a frequency characteristic of a via structure according to an embodiment of the present invention. This diagram is merely an example, which should not unduly limit the scope of the claims herein. One of ordinary skill in the art would recognize many variations, alternatives, and modifications. As shown, the horizontal axis illustrates frequency while the vertical axis illustrates attenuation. The first plot illustrates a low pass filter including 16 pH via structure ground connection. The second plot illustrates a 1.6 pH via structure ground connection, which has improved stop band attenuation. These are simple low pass filters using a single via hole to connect the filter to the ground reference. Although the inductance of the via hole helps filter performance at one particular frequency (i.e. the frequency at which a deep notch occurs) it reduces filter performance (attenuation) above this notch frequency. The benefit of reducing inductance of via holes lies in increasing the attenuation of the filter at high frequencies.

A method of manufacturing bonded substrates according to an embodiment of the present invention may be outlined as follows.

1. Provide a metallic substrate;
2. Bond a first thickness of compound semiconductor material overlying the metallic substrate;
3. Reduce a thickness of the first thickness of compound semiconductor material to a second thickness;
4. Form a trench region surrounding a portion of the second thickness of the compound semiconductor material;
5. Forming a conductive material within the trench region to isolate the portion of the second thickness of the compound semiconductor using the conductive material in the trench region and a portion of the underlying metallic substrate; and
6. Perform other steps, as desired.

As shown, the method provides a way of manufacturing a bonded substrate. As merely an example, the method forms a metallic isolation structure, which encloses a portion of compound semiconductor material. The isolated metallic structure has improved properties, e.g., greater electrical and thermal isolation from surrounding circuitry. Further details of the present method and resulting device can be found throughout the present specification and more particularly below.

FIGS. 9–15 illustrate a simplified method of forming a semiconductor device according to an alternative embodiment of the present invention. This method is merely an example, which should not unduly limit the scope of the claims herein. One of ordinary skill in the art would recognize many variations, alternatives, and modifications. As shown, the method begins by providing a metallic substrate 900, which is similar to the one noted above but can also be others. A compound semiconductor material layer 901 has been bonded to the metallic substrate. Depending upon the embodiment, the compound semiconductor material 901 can be any one of the ones described herein, as well as others, including multilayered structures, depending upon the embodiment. A plurality of integrated device structures 902 have been formed overlying the compound semiconductor material. These device structures including, among others, transistors, diodes, resistors, capacitors, inductors, and circuits made from these components such as amplifiers, mixers, switches. Of course, the particularly integrated device structures depend upon the application.

Figure 10:
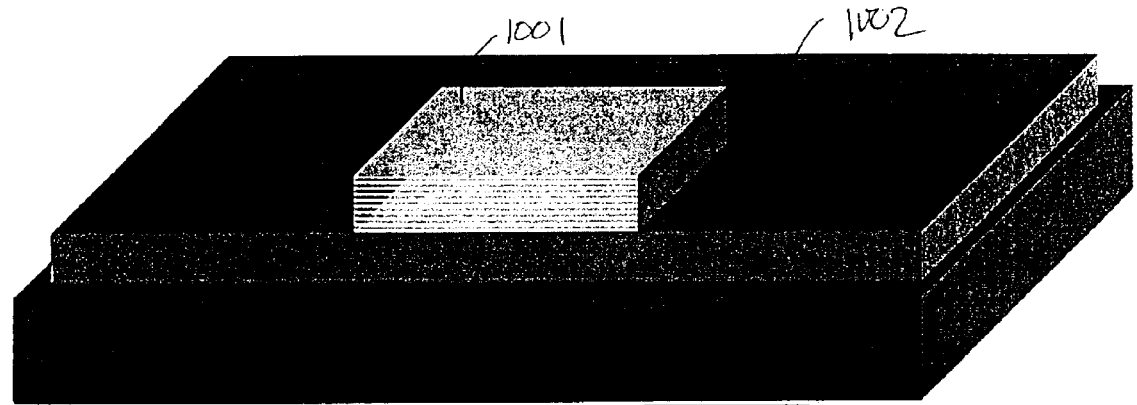
Figure 11:
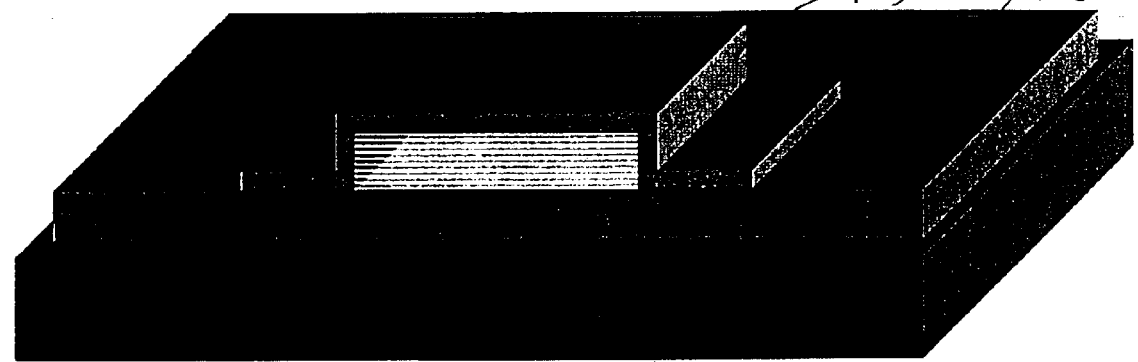

As further shown, an insulating material 1001 is formed overlying an upper surface of the integrated circuit device structures as illustrated by FIG. 10. The insulating material can include a dielectric, such as polyimide material, but can also be others. The polyimide material is patterned to form one or more patterns 1001. The polyimide is formed overlying the integrated circuit device and is free from attachment on other regions 1002 of the compound semiconductor material. Referring to FIG. 11, the method forms a metal layer 1103, which has been patterned to enclose the polyimide layer and a portion of the compound semiconductor material. Other portions of the metal have been selectively removed, as shown by reference numeral 1105.

Figure 12:
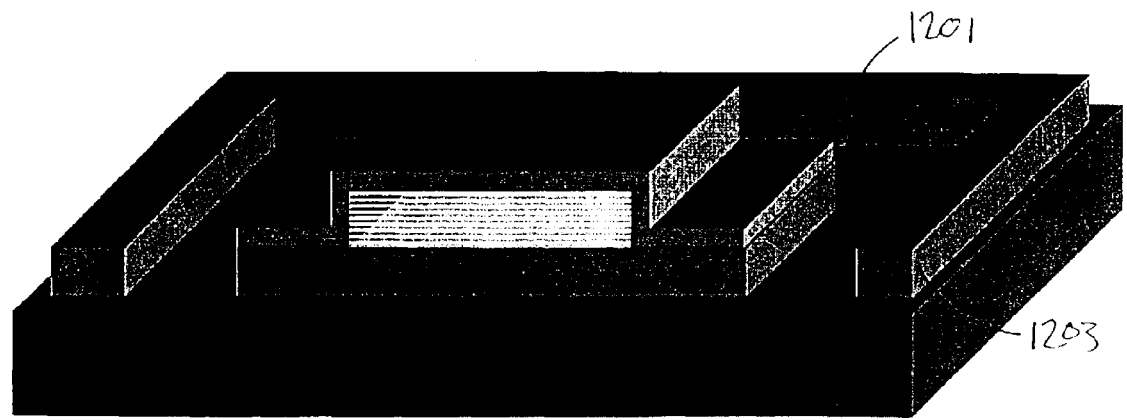
Figure 13:
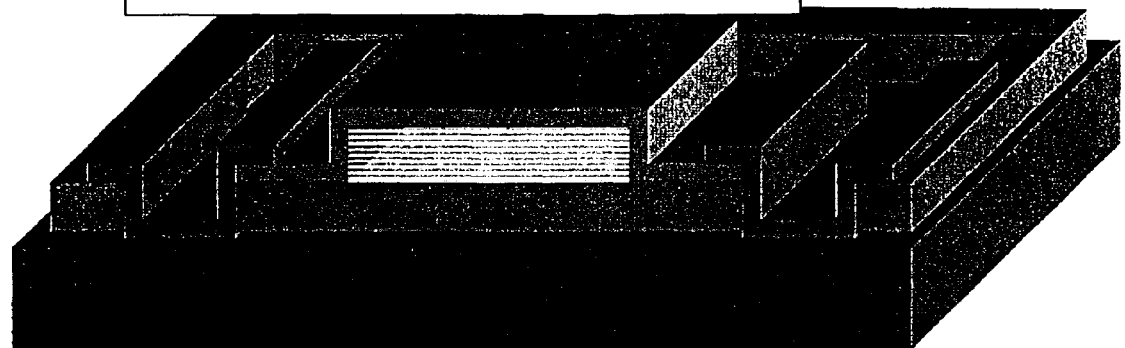
Figure 14:
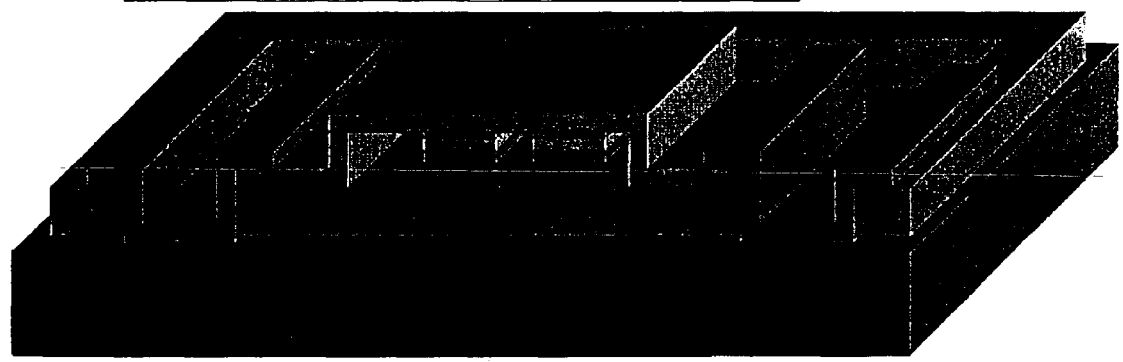
Figure 15:
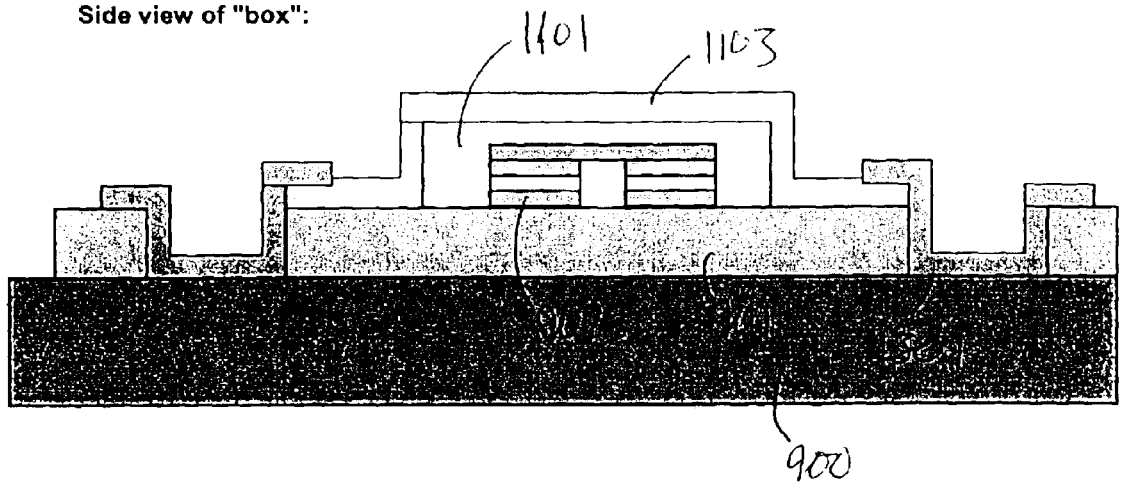

The method patterns a region 1201 surrounding the polyimide metal sandwich layer, as shown in FIG. 12. The region is a trench region that surrounds the periphery of the polyimide metal sandwich layer, which is overlying the integrated circuit device. The method can use a photolithography and etching technique depending upon the embodiment. The trench region has a width of about 50 microns and length of about 500 microns. A depth is about 50 microns but depends upon the embodiment. The method then forms a metal layer 1301 contacting the metal layer overlying the polyimide and a portion of the metal substrate 901. Optionally, the polyimide layer is removed underlying the metal layer to form an "air bridge" that reduces capacitance to the integrated circuit device or other active circuitry formed thereon. A side-view diagram of the device, including the air bridge, is illustrated by way of FIG. 15. As shown, the device includes air bridge 1401 between metal layer 1103 and device structure 902. The device is provided on compound semiconductor layer 901, which is bonded to metal substrate 900. Via structures are formed to connect metal substrate 1301 via metal layer 1301 to metal layer 1103. As shown, the method forms a box structure around a peripheral region of the device, which has been isolated using the metal box structure. Depending upon the embodiment, there can be many variations, modifications, and alternatives.

As shown, the metal layer can also act as a thermal conductive feature, which will be provided in more detail below. Here, the invention provides an integrated circuit device structure. The integrated circuit device structure includes a metallic substrate, which has a predetermined thickness and a predetermined thermal conductivity. A thickness of compound semiconductor material is bonded to a surface overlying the metallic substrate. A trench region is disposed within a portion of the thickness of the compound semiconductor material and extending to a portion of the metallic substrate. A thermal conductive material (e.g., metal layer) is formed within the trench region and thermally coupled to the portion of the metallic substrate. The thermal conductive material is coupled (e.g., directly connected to physically) to the portion of the thickness of the compound semiconductor to redistribute thermal energy among the portion of the compound semiconductor, the thermal conductive material, and the metallic substrate. Preferably, any hot spots are prevented during operation of a resulting integrated circuit device. The metal substrate structure acts as a sink for thermal energy.

Various alterations, modifications and substitutions can be made to the arrangements and techniques described herein, as would be apparent to one skilled in the relevant art in the light of this disclosure without departing form the scope and spirit of this invention.

What is claimed is:

1. A method for manufacturing composite substrates for semiconductor devices, the method comprising:
    providing a metal substrate, the metal substrate having first diameter and having a bonding surface;
    bonding a plurality of tiles overlying the bonding surface, each of the tiles being coupled to a portion of the bonding surface, each of the tiles having a shape and size to be able to form an array configuration;
    elevating a temperature of the plurality of tiles and metal substrate;
    forming a eutectic bond between each of plurality of tiles and portion of the bonding surface, whereupon the elevating of the temperature is provided while each of the tiles is substantially stationary relative to the metal substrate;
    forming a plurality of active devices on each of the plurality of tiles;
    forming a plurality of openings through each of tiles, each of the openings traversing through a portion of one of the tiles through a portion of the eutectic bond to a portion of the metal substrate to form a via structure;
    forming an interconnect layer to connect the portion of the one of the active devices through the portion of the tile through the eutectic bond to the portion of the metal substrate;
    whereupon the interconnect layer that connects the portion of one of the active devices through the portion of one of the tiles through the portion of the eutectic bond to the portion of the metal substrate.

2. The method of claim 1 wherein the forming of the plurality of openings in each of the tiles further comprises coating the plurality of active devices using a photolithographic material and patterning the coating to form regions corresponding to the openings.

3. The method of claim 2 wherein the patterning comprises an etching process.

4. The method of claim 1 wherein each of the tiles comprises an entity selected from gallium arsenide, indium phosphide, gallium nitride, and silicon carbide.

5. The method of claim 1 wherein each of the openings is a via structure.

6. The method of claim 1 wherein the eutectic bond is provided using an alloy selected from a low melting temperature metal including indium, tin and an oxidation-resistant metal.

7. The method of claim 1 wherein the array configuration is an N by M array of the tiles, each of the tiles being coupled to another tile.

8. The method of claim 1 wherein each of the openings is characterized by an aspect ratio of greater than 2 to 1.

9. The method of claim 1 wherein the interconnect layer comprises gold over platinum over titanium.

10. The method of claim 1 wherein the interconnect layer comprises a barrier metal layer underlying a conductive layer.

11. The method of claim 1 wherein the metal substrate provides a ground plane.

12. A method of manufacturing bonded substrates, the method comprising: providing a metallic substrate, the metal substrate having a predetermined thickness;
    bonding a first thickness of compound semiconductor material overlying the metallic substrate;
    reducing a thickness of the first thickness of compound semiconductor material to a second thickness; and
    forming one or more via structures through a portion of the second thickness of compound semiconductor material to a portion of the underlying metal substrate, whereupon the via structure electrically connects to the metal substrate.

13. The method of claim 12 wherein the second thickness of compound semiconductor substrate is less than 100 microns.

14. The method of claim 13 wherein the second thickness of compound semiconductor material is unstable without the metal substrate.

15. The method of claim 13 wherein the via structure has an aspect ratio is greater than 2 to 1.

16. The method of claim 12 wherein the metal substrate is characterized by a first thermal expansion coefficient and the compound semiconductor is characterized by a second thermal expansion coefficient, whereupon the first thermal expansion coefficient is within a predetermined amount of the second thermal expansion coefficient.

17. The method of claim 12 wherein the predetermined amount is characterized to prevent any damage to the compound semiconductor through a temperature range from about room temperature to 550 Degrees Celsius.

18. The method of claim 12 further comprising processing the second thickness of compound semiconductor through one or more manufacturing processes for integrated circuits.

19. The method of claim 18 wherein the one or more manufacturing processes includes at least an alloying process to form a contact between the compound semiconductor and a metal layer.

20. The method of claim 19 wherein alloying process is an annealing process.

21. A method of manufacturing bonded substrates, the method comprising: providing a metallic substrate, the metallic substrate having a predetermined thickness;
    bonding a first thickness of compound semiconductor material overlying the metallic substrate;
    reducing a thickness of the first thickness of compound semiconductor material to a second thickness; and
    forming one or more trench structures through a portion of the second thickness of the compound semiconductor through a side opposite of a backside of the metallic substrate;
    forming one or more metal structures within the one or more trench structures to form one or more respective via structures within the portion of the second thickness of compound semiconductor material to a portion of the underlying metal substrate, whereupon the via structure electrically connects to the metal substrate.

22. A method of manufacturing bonded substrates, the method comprising: providing a metallic substrate, the metal substrate having a predetermined thickness;
    bonding a first thickness of compound semiconductor material overlying the metallic substrate;
    reducing a thickness of the first thickness of compound semiconductor material to a second thickness; and forming a trench region surrounding a portion of the second thickness of the compound semiconductor material; and forming a conductive material within the trench region to isolate the portion of the second thickness of the compound semiconductor using the conductive material in the trench region and a portion of the underlying metallic substrate.

23. The method of claim 22 exposing an upper portion of the portion of the second thickness of the compound semiconductor.

24. The method of claim 22 further comprising forming an insulating layer overlying the exposed upper portion.

25. The method of claim 24 further comprising forming a metal layer overlying the insulating layer and connecting to the conductive material in the trench region to enclose the portion of the second thickness of the compound semiconductor.

* * * * *